US012483192B2

(12) United States Patent
Iqbal et al.

(10) Patent No.: US 12,483,192 B2
(45) Date of Patent: Nov. 25, 2025

(54) TEMPERATURE COMPENSATION IN OSCILLATOR CIRCUITS

(71) Applicant: NXP USA, Inc., Austin, TX (US)

(72) Inventors: Sadique Mohammad Iqbal, Karimganj (IN); Divya Tripathi, Noida (IN); Anubhav Srivastava, Gorakhpur (IN); Krishna Thakur, GautamBudh Nagar (IN)

(73) Assignee: NXP USA, Inc., Austin, TX (US)

( * ) Notice: Subject to any disclaimer, the term of this patent is extended or adjusted under 35 U.S.C. 154(b) by 8 days.

(21) Appl. No.: 18/509,014

(22) Filed: Nov. 14, 2023

(65) Prior Publication Data
US 2024/0388252 A1    Nov. 21, 2024

(30) Foreign Application Priority Data
May 17, 2023 (IN) .............................. 202311034695

(51) Int. Cl.
*H03B 5/24* (2006.01)
*H03B 5/04* (2006.01)
*H03K 19/0175* (2006.01)

(52) U.S. Cl.
CPC ................ *H03B 5/24* (2013.01); *H03B 5/04* (2013.01); *H03K 19/017509* (2013.01)

(58) Field of Classification Search
CPC ...................................................... H03B 5/24
USPC ........................................................ 331/111
See application file for complete search history.

(56) References Cited

U.S. PATENT DOCUMENTS

| 7,102,452 | B1 | 9/2006 | Holmes | |
|---|---|---|---|---|
| 8,497,741 | B2 * | 7/2013 | Pedersen | ............ H03K 3/02315 |
| | | | | 331/34 |
| 8,994,459 | B2 * | 3/2015 | Patasani | ................... H03L 7/02 |
| | | | | 331/34 |
| 9,287,823 | B1 * | 3/2016 | Holzmann | ............. H10D 30/00 |
| 9,612,607 | B2 | 4/2017 | Kumar et al. | |
| 10,032,106 | B2 | 7/2018 | Entner | |
| 10,461,700 | B2 | 10/2019 | Liang et al. | |
| 10,666,235 | B1 | 5/2020 | Chou et al. | |
| 10,985,767 | B2 * | 4/2021 | Chen | ........................ H03L 7/099 |
| 11,043,936 | B1 * | 6/2021 | Wu | ........................ H03K 4/501 |

(Continued)

OTHER PUBLICATIONS

Shanshan Dai and Jacob K. Rosenstein A 14.4nW 122KHz Dual-phase Current-mode Relaxation Oscillator for Near-Zero-Power Sensors, Sep. 2015, IEEE Sustom Intergrated Circuits Conference (CICC) (Year: 2015).*

(Continued)

*Primary Examiner* — Joseph Chang (57) ABSTRACT

Systems and methods for providing temperature compensation in oscillators circuits are discussed. In various embodiments, these systems and methods may be implemented in technologies where only resistors with the same type (positive or negative) of temperature coefficients of resistance are available. For example, in some implementations, an oscillator circuit may include a voltage generator coupled to an input terminal of a common gate amplifier through a first resistor, and a frequency-to-voltage converter coupled to another input terminal of the common gate amplifier through a second resistor, where the second resistor may be configured to reduce a frequency variation of the oscillator circuit in response to temperature changes.

20 Claims, 5 Drawing Sheets

(56) References Cited

U.S. PATENT DOCUMENTS

| | | | |
|---|---|---|---|
| 11,437,981 B1 | 9/2022 | Liberti et al. | |
| 2011/0156760 A1* | 6/2011 | Bhuiyan | H03K 17/162 |
| | | | 331/16 |
| 2012/0161868 A1* | 6/2012 | Yayama | H03L 1/00 |
| | | | 330/252 |
| 2014/0002197 A1* | 1/2014 | Patasani | H03L 7/02 |
| | | | 331/34 |
| 2014/0312981 A1* | 10/2014 | Nakamura | H03L 1/022 |
| | | | 331/34 |
| 2015/0180483 A1* | 6/2015 | Astrom | H03L 7/18 |
| | | | 331/25 |
| 2022/0399897 A1 | 12/2022 | Chen et al. | |
| 2024/0113660 A1* | 4/2024 | Tripathi | H03L 7/02 |
| 2024/0388252 A1* | 11/2024 | Iqbal | H03K 19/017509 |

OTHER PUBLICATIONS

Yi-Chun Shih et al: "An On-Chip Tunable Frequency Generator for Crystal-Less Low-Power WEAN Radio", Apr. 2013, pp. 187-191, vol. 60, No. 4, IEEE Transactions on Circuits and Systems II: Express Briefs, IEEE, USA.

\* cited by examiner

TEMPERATURE COMPENSATION IN OSCILLATOR CIRCUITS

CROSS-REFERENCE TO RELATED APPLICATIONS

This application claims the priority under 35 U.S.C. § 119 of India application Ser. No. 202311034695, filed on 17 May 2023, the contents of which are incorporated by reference herein.

FIELD

This disclosure relates generally to electronic circuits, and more specifically, to systems and methods for providing temperature compensation in oscillators circuits.

BACKGROUND

An oscillator is an electronic circuit that produces a periodic, Alternating Current (AC) signal—e.g., a sine, square, or triangle wave—based upon a Direct Current (DC) input received from a power supply. Such circuits may be used in many different types of electronic devices, including clock generators, digital instruments, computers, processors, peripherals, etc.

The frequency of a conventional oscillator's output signal varies according to its operating temperature. In an "RC oscillator," for instance, although the effective capacitance (C) of the circuit may not vary much in response to temperature changes, the effective resistance (R) does.

To address this, a temperature-compensated oscillator may include a first resistor having a positive temperature coefficient of resistance and a second resistor having a negative temperature coefficient of resistance. The resistors may be arranged in a way such that the effects of temperature upon the latter cancel out opposing effects upon the former. As a result, the frequency of a signal output by such temperature-compensated oscillator is less sensitive to temperature changes.

The inventors hereof have recognized, however, that in certain semiconductor manufacturing technologies (e.g., Fin Field Effect Transistor or "FinFET"), resistors with positive and negative coefficients may not be available on the same substrate, which again subjects oscillators fabricated thereon to frequency variation due to temperature changes.

BRIEF DESCRIPTION OF THE DRAWINGS

The present invention(s) are illustrated by way of example and are not limited by the accompanying figures, in which like references indicate similar elements. Elements in the figures are illustrated for simplicity and clarity and have not necessarily been drawn to scale.

DETAILED DESCRIPTION

Systems and methods described herein may reduce an oscillator's output frequency variation in response to temperature changes in order to meet the ever-increasing accuracy and precision demands faced by today's Integrated Circuit (IC) designers. These systems and methods are well suited for semiconductor manufacturing technologies where resistances have "only positive" or "only negative" temperature coefficients of resistance, such as, for example, 16 nm fin-shaped field-effect transistor (FinFET) technologies, or the like.

In various implementations, the oscillator's output frequency variation may be reduced, at least in part, through the selection of a resistor configured to couple a frequency-to-voltage converter to a common gate amplifier.

Figure 1:
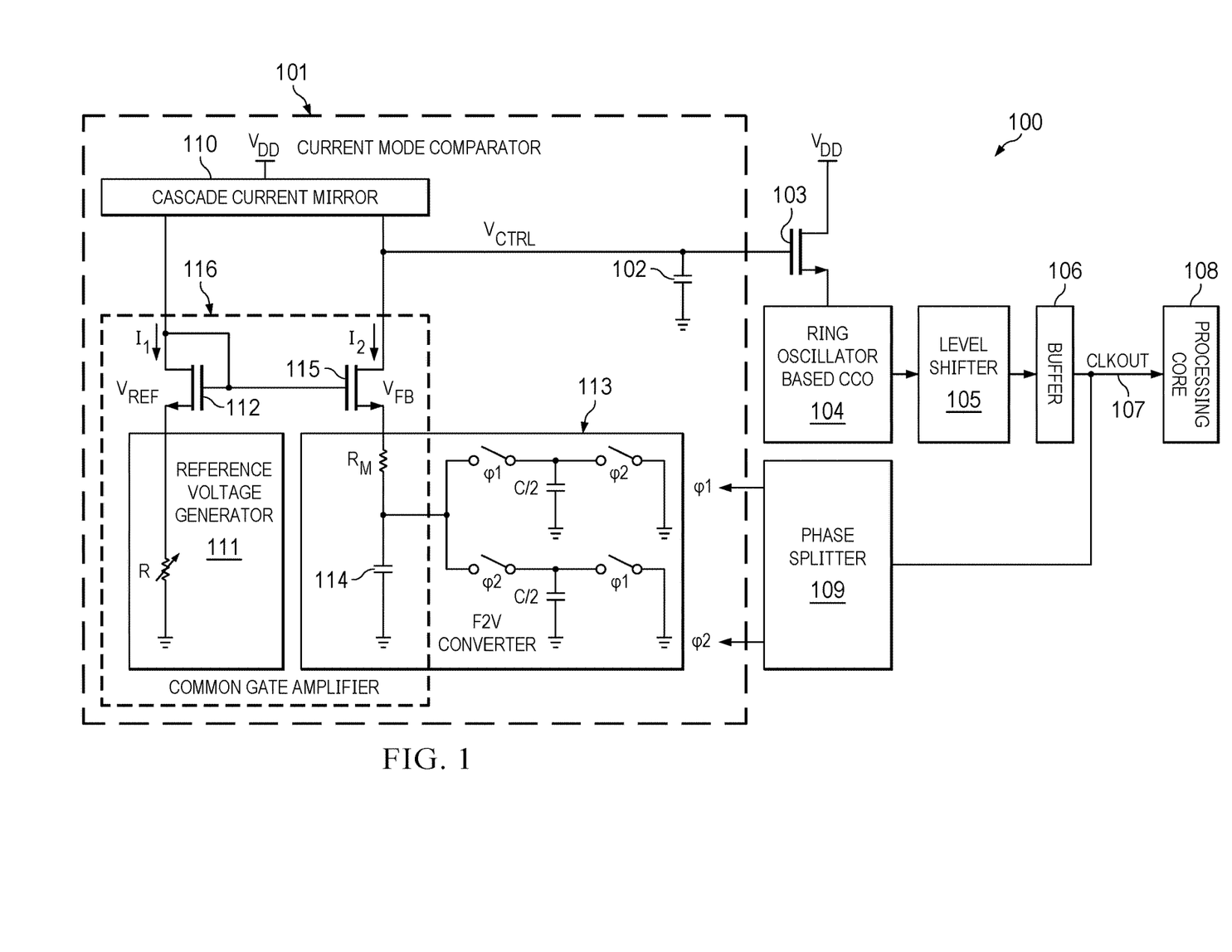
FIG. 1 is a circuit diagram of an example of a Frequency Regulated Oscillator (FRO) circuit, according to some embodiments.

To illustrate the foregoing, FIG. 1 is a circuit diagram of Frequency Regulated Oscillator (FRO) circuit 100. In this example, FRO circuit 100 constitutes a low power RC oscillator, although in other examples other types of oscillators may be used. Although output signal 107 is characterized as a clock signal provided to processing core 108, in other examples FRO circuit 100 may provide different types of output signals to other types of circuits.

As shown, the output of current mode comparator 101 is coupled to the gate terminal of output transistor 103 (e.g., an n-channel metal-oxide semiconductor or "NMOS" transistor), which in turn is coupled to Current Controlled Oscillator (CCO) element 104 (e.g., a ring oscillator). The drain terminal of output transistor 103 is coupled to supply voltage rail ($V_{DD}$), and the source terminal of output transistor 103 is coupled to CCO element 104.

CCO element 104 is coupled to level shifter 105. Level shifter 105 is configured to change the voltage level of its input, which is then provided to buffer 106 to produce output signal 107 (e.g., a clock signal or "CLKOUT") for use by processing core 108 (e.g., in a Systems-on-Chip or "SoC").

To attain frequency regulation, output signal 107 is received by phase splitter 109, which provides phases $\varphi_1$ and $\varphi_2$ (complementary clocks) back to current mode comparator 101. Frequency-to-voltage (F2V) converter 113 comprises a switched capacitor circuit configured to generate a voltage corresponding to an input frequency. Specifically, F2V converter 113 applies $\varphi_1$ and $\varphi_2$ to a network of switches and capacitors (C/2) coupled to common gate amplifier 116.

Current mode comparator 101 includes cascode current mirror 110, which receives voltage supply $V_{DD}$. Current mode comparator 101 includes an input terminal via first NMOS transistor 112 where first current $I_1$ flows, and an output terminal via second NMOS transistor 115 where second current $I_2$ flows. The gates of first and second NMOS transistors 112 and 115 are coupled to each other.

The source terminal of first NMOS transistor 112 applies reference voltage $V_{ref}$ across reference voltage generator 111, which includes trimmed resistor R, such that $V_{ref}=I_1*R$.

Meanwhile, the source terminal of second NMOS transistor 115 produces feedback voltage $V_{FB}$ across compensating resistance $R_m$ (coupled to ground via filter capacitor 114) and switch capacitors (C=C/2+C/2) in F2V converter 113, such that $V_{FB}=I_2*(R_m+1/sC)$.

The drain terminal of second NMOS transistor 115 maintains $V_{ctrl}$, which is coupled to compensating capacitor 102 and to the gate terminal of output transistor 103.

In some embodiments, the temperature coefficients of resistance of R and $R_m$ may both be positive. Alternatively, the temperature coefficients of resistance of R and $R_m$ may both be negative. Moreover, as described below, the resistance value of $R_m$ may be selected to reduce a frequency dependency of output signal 107 with respect to changes in the operating temperature of FRO circuit 100.

FRO circuit 100 may be fabricated on an integrated circuit (IC) wafer or die using one of the many IC process technologies. For example, FRO circuit 100 may be integrated in a substrate or die manufactured from various semiconductor materials, such as Silicon (Si), Germanium (Ge), or Gallium arsenide (GaAs), using various technologies such as complementary metal-oxide semiconductor (CMOS), silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, etc.

In some deployments, FRO circuit 100 may be part of a larger digital logic system. For instance, FRO circuit 100 may be coupled to a power amplifier (PA) control system. In certain embodiments, all or part of the larger digital logic system including circuit 100 may be fabricated on a single chip. The single chip may be created using a single IC fabrication process or using multiple IC fabrication processes in combination.

For example, a digital logic chip containing FRO circuit 100 may be integrated in a substrate or die manufactured from various semiconductor materials. Different subsystems may each be fabricated using a unique IC material or process, or set of IC materials and processes. Within a larger digital system, circuit 100 may be fabricated using one set of IC materials and processes, and another subsystem may be fabricated using a different set of IC materials and processes. In various embodiments, FRO circuit 100 may be part of a larger digital logic system patterned onto a single chip, and it may occupy less than 5% or 1% of the total chip area.

Figure 2:
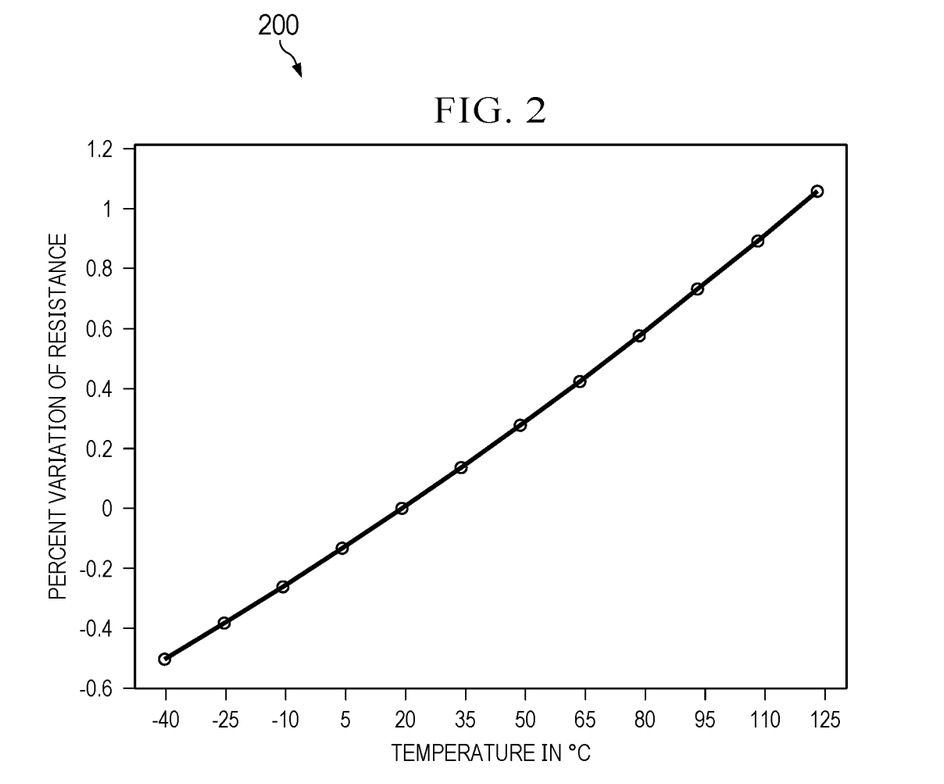
FIG. 2 is a graph showing resistance variation with temperature changes for an example of a first resistor coupled to a first input of a common gate amplifier of the FRO circuit, according to some embodiments.
Figure 3:
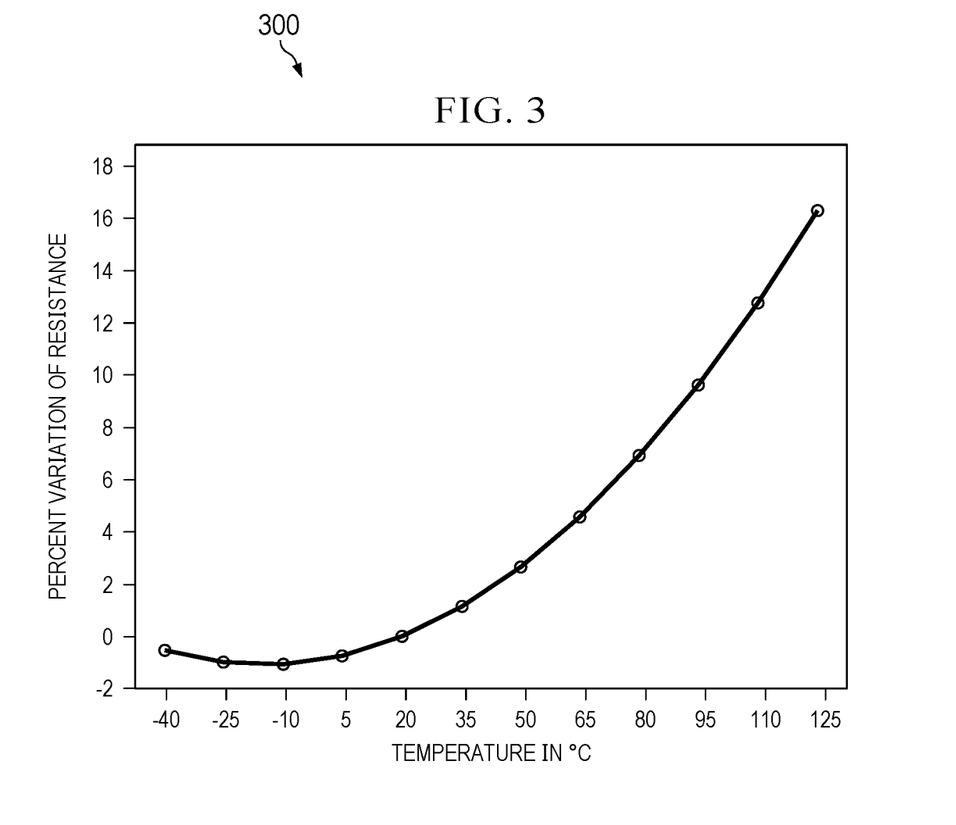
FIG. 3 is a graph showing resistance variation with temperature changes for an example of a second resistor coupled to a second input of the common gate amplifier of the FRO circuit, according to some embodiments.

FIG. 2 shows graph 200 illustrating an example of resistance variation with temperature changes for first resistor R coupled to the first input of common gate amplifier 116. Meanwhile, FIG. 3 shows graph 300 illustrating an example of resistance variation with temperature changes for second resistor $R_m$ coupled to the second input of common gate amplifier 116.

Each of graphs 200 and 300 illustrates a different, yet positive temperature coefficient of resistance for resistors R and $R_m$.

Specifically, graph 200 shows that trimmed resistor R has a temperature coefficient of resistance α, such that its resistance varies linearly between approximately −0.04% and 1% as the temperature changes between −40° C. and 125° C.

Graph 300 shows that compensating resistor $R_m$ has a temperature coefficient of resistance β, such that its resistance varies non-linearly between approximately −1% and 16% as the temperature changes between −40° C. and 125° C.

Given α and β, the resistance of compensating resistor $R_m$ may be selected as follows. Once current mirror 110 gets locked, then:

$$V_{ref} = V_{FB} \therefore$$
$$I_1*R = I_2*(R_m + 1/sC).$$
Also, since $I_1 = I_2$:
$$R = (R_m + 1/sC) \therefore$$
$$s = 1/(R - R_m)*C$$

Accordingly, the effective resistance $R_{eff}$ of circuit 100 is given by:

$$R_{eff} = R(1 + \alpha\Delta T) - R_m(1 + \beta\Delta T) \therefore$$
$$R_{eff} = (R - R_m) + (R*\alpha - R_m*\beta)*\Delta T$$

where ΔT represents a temperature change.

As such, so long as $R*\alpha=R_m*\beta$, or $R_m=R*\alpha/\beta$, the frequency of output signal 107 remains independent of temperature changes. In practice, although the values of α and β themselves vary with temperature, selection of $R_m=R*\alpha/\beta$ may nonetheless reduce, minimize, or eliminate frequency variation of output signal 107.

Figure 4:
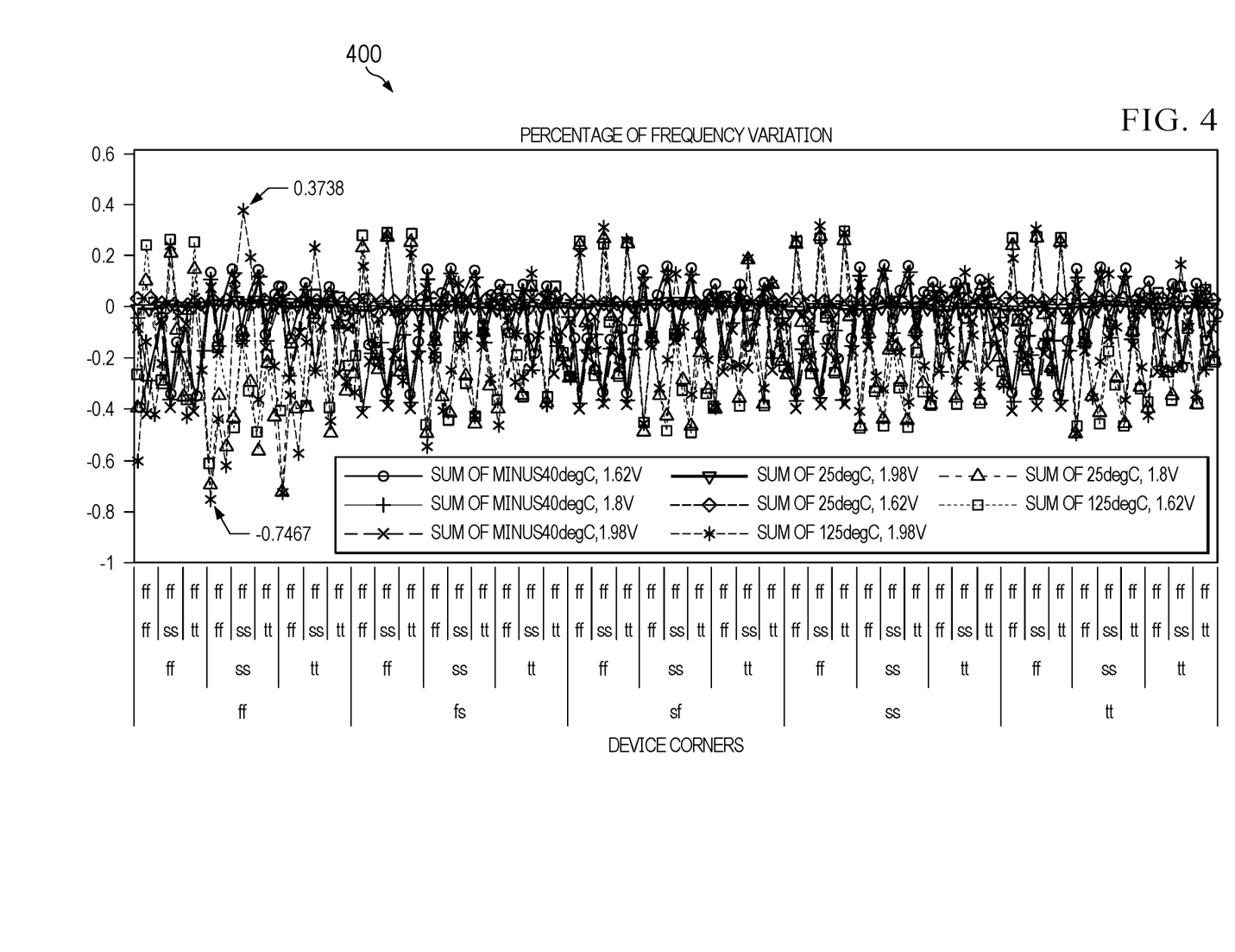
FIG. 4 is a graph showing the frequency variation of an output signal produced by the FRO circuit with temperature compensation, according to some embodiments.
Figure 5:
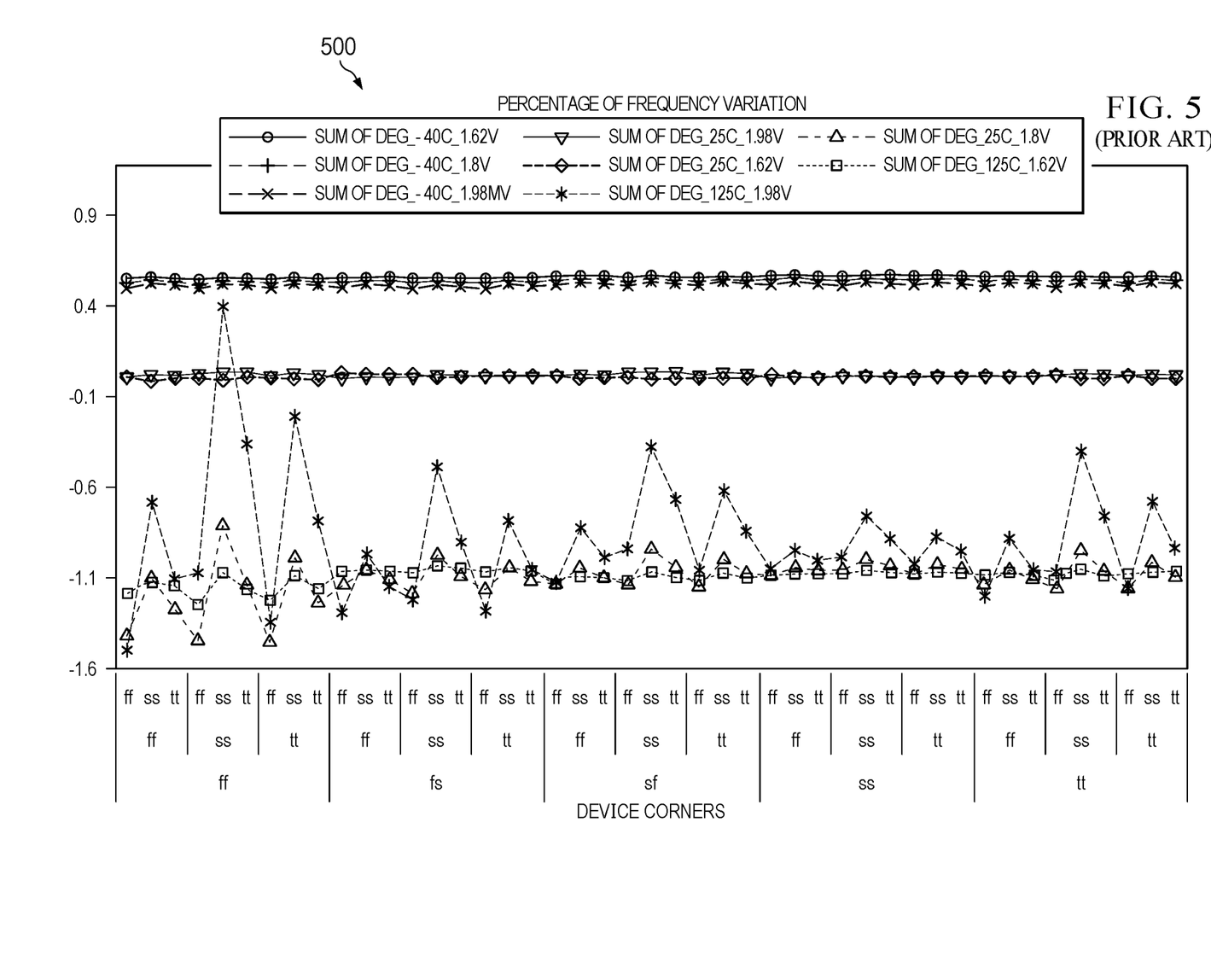
FIG. 5 is a graph showing the frequency variation of an output signal of an FRO circuit without temperature compensation ("Prior Art").

FIG. 4 shows graph 400 illustrating an example of frequency variation of output signal 107 produced by FRO circuit 100 with temperature compensation. FIG. 5 shows graph 500 illustrating an example of frequency variation of an output signal of a prior art FRO circuit without temperature compensation, for sake of comparison.

Each of graphs 400 and 500 provides curves that show a percentage of frequency variation of their respective circuits' outputs against device corners (typical-typical or "TT," fast-fast or "FF," slow-slow or "SS," fast-slow or "FS," and slow-fast "SF") for a number of temperatures and supply voltages.

Resistance R within reference voltage generator 111 may be trimmed at typical voltage and temperature and the output frequency is maintained close to 32 kHz (within +/−1%). Trimming may be done across all process corners, and the post-trim frequency can vary due to voltage and temperature changes. Graphs 400 and 500 show that post-trim frequency variation across voltage and temperature is less than +/−1% of 32 kHz. For example, the curve labeled "sum of −40° C., 1.62 V" shows the frequency variation with respect to the frequency value at typical voltage (e.g., 1.8 V) and typical temperature (e.g., 25° C.). Furthermore, the frequency variation across voltage and temperature may be different at each device corner.

As shown, graph 400 depicts a frequency variation of 0.3738% to −0.7467% while graph 500 depicts a frequency variation of 0.5% to −1.5%. In other words, the output of FRO circuit 100 with temperature compensation (i.e., with $R_m$ such that $R_m=R*\alpha/\beta$) is subject to significantly reduced frequency variation compared to the output of a conventional circuit.

As such, the systems and methods described herein may provide temperature compensation in low current, low power, closed loop FRO oscillators. These systems and methods may implement temperature compensation using one or more resistors, and may be particularly applicable to devices fabricated using semiconductor manufacturing technologies where only one type of temperature coefficient of resistance (either positive or negative) is available.

In an illustrative, non-limiting embodiment, an oscillator circuit may include: a voltage generator coupled to an input terminal of a common gate amplifier through a first resistor, and a frequency-to-voltage converter coupled to another input terminal of the common gate amplifier through a second resistor. Moreover, the second resistor may be configured to reduce a frequency variation of the oscillator circuit in response to temperature changes.

In some cases, the oscillator may be fabricated with FinFET technology.

The oscillator circuit may also include a CCO coupled to an output terminal of a current mode comparator, a level shifter coupled to the CCO, a buffer coupled to the level shifter, and a phase splitter coupled to the buffer. The phase splitter may be coupled to the frequency-to-voltage converter.

In some implementations, the second resistance of the second resistor may be selected to reduce a difference between: (a) a product between a first resistance value of the first resistor and a first positive temperature coefficient of the first resistor, and (b) a product between the second resistance value of the second resistor and a second positive temperature coefficient of the second resistor. The first positive temperature coefficient may be different from the second positive temperature coefficient.

In other implementations, the second resistance of the second resistor may be selected to reduce a difference between: (a) a product between a first resistance value of the first resistor and a first negative temperature coefficient of the first resistor, and (b) a product between the second resistance value of the second resistor and a second negative temperature coefficient of the second resistor. The first negative temperature coefficient may be different from the second negative temperature coefficient.

In another illustrative, non-limiting embodiment, an electronic device may include: a circuit and an oscillator configured to provide a clock signal to the circuit, the oscillator further including a common gate amplifier coupled to a voltage generator through a first resistor and to a frequency-to-voltage converter through a second resistor, where the second resistor has a second resistance selected based, at least in part, upon a product between a first resistance of the first resistor and a temperature coefficient of the first resistor.

The temperature coefficient may include a first positive temperature coefficient, and the second resistance may be selected based, at least in part, upon a difference between: (a) a product between the first resistance and the first positive temperature coefficient, and (b) a product between the second resistance and a second positive temperature coefficient of the second resistor. The first positive temperature coefficient may be different from the second positive temperature coefficient.

Alternatively, the temperature coefficient may include a first negative temperature coefficient, and the second resistance may be selected based, at least in part, upon a difference between: (a) a product between the first resistance and the first negative temperature coefficient, and (b) a product between the second resistance and a second negative temperature coefficient of the second resistor. The first negative temperature coefficient is different from the second negative temperature coefficient.

In yet another illustrative, non-limiting embodiment, a method may include: coupling a voltage generator to a common gate amplifier through a first resistor; and coupling a frequency-to-voltage converter to the common gate amplifier through a second resistor, where the second resistor has a second resistance selected based, at least in part, upon a first resistance of the first resistor.

The second resistance may be selected based, at least in part, upon a difference between: (a) a product between the first resistance and a first positive temperature coefficient of the first resistor, and (b) a product between the second resistance and a second positive temperature coefficient of the second resistor.

Alternatively, the second resistance may be selected based, at least in part, upon a difference between: (a) a product between the first resistance and a first negative temperature coefficient of the first resistor, and (b) a product between the second resistance and a second negative temperature coefficient of the second resistor.

In many implementations, systems and methods described herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, wearable devices, Internet-of-Things (IoT) devices, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

For sake of brevity, conventional techniques have not been described in detail herein. Furthermore, the connecting lines shown in the various figures contained herein have been intended to illustrate relationships (e.g., logical) or physical couplings (e.g., electrical) between the various elements. It should be noted, however, that alternative relationships and connections may be used in other embodiments. Moreover, circuitry described herein may be implemented either in silicon or another semiconductor material or alternatively by software code representation thereof.

Although the invention(s) are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

We claim:

1. An oscillator circuit, comprising:
a voltage generator coupled to an input terminal of a common gate amplifier, the voltage generator having a first resistor coupled to the input terminal; and
a frequency-to-voltage converter coupled to another input terminal of the common gate amplifier, the frequency-to-voltage converter having a second resistor coupled to the another input terminal, wherein the second resistor is configured to reduce a frequency variation of the oscillator circuit in response to temperature changes, wherein temperature coefficients of the first resistor and the second resistor are either both positive temperature coefficients or both negative temperature coefficients.

2. The oscillator circuit of claim 1, wherein the oscillator is fabricated with fin-shaped field-effect transistor (FinFET) technology.

3. The oscillator circuit of claim 1, further comprising a current-controlled oscillator (CCO) coupled to an output terminal of a current mode comparator.

4. The oscillator circuit of claim 1, further comprising a level shifter coupled to the CCO.

5. The oscillator circuit of claim 1, further comprising a buffer coupled to the level shifter.

6. The oscillator circuit of claim 1, further comprising a phase splitter coupled to the buffer.

7. The oscillator circuit of claim 6, wherein the phase splitter is coupled to the frequency-to-voltage converter.

8. The oscillator circuit of claim 1, wherein a second resistance of the second resistor is selected to reduce a difference between: (a) a product between a first resistance value of the first resistor and a first positive temperature coefficient of the first resistor, and (b) a product between the second resistance value of the second resistor and a second positive temperature coefficient of the second resistor.

9. The oscillator circuit of claim 8, wherein the first positive temperature coefficient is different from the second positive temperature coefficient.

10. The oscillator circuit of claim 1, wherein a second resistance of the second resistor is selected to reduce a difference between: (a) a product between a first resistance value of the first resistor and a first negative temperature coefficient of the first resistor, and (b) a product between the second resistance value of the second resistor and a second negative temperature coefficient of the second resistor.

11. The oscillator circuit of claim 10, wherein the first negative temperature coefficient is different from the second negative temperature coefficient.

12. An electronic device, comprising:
a circuit; and
an oscillator configured to provide a clock signal to the circuit, the oscillator further comprising a common gate amplifier having a first input coupled to a voltage generator, the voltage generator having a first resistor coupled to the first input, and having a second input coupled to a frequency-to-voltage converter, the frequency-to-voltage converter having a second resistor coupled to the second input, wherein the second resistor has a second resistance selected based, at least in part, upon a product between a first resistance of the first resistor and a temperature coefficient of the first resistor, wherein temperature coefficients of the first resistor and the second resistor are either both positive temperature coefficients or both negative temperature coefficients.

13. The electronic device of claim 12, wherein the circuit comprises a processing core fabricated with fin-shaped field-effect transistor (FinFET) technology.

14. The electronic device of claim 12, wherein the temperature coefficient comprises a first positive temperature coefficient, and wherein the second resistance is selected based, at least in part, upon a difference between: (a) a product between the first resistance and the first positive temperature coefficient, and (b) a product between the second resistance and a second positive temperature coefficient of the second resistor.

15. The electronic device of claim 14, wherein the first positive temperature coefficient is different from the second positive temperature coefficient.

16. The electronic device of claim 12, wherein the temperature coefficient comprises a first negative temperature coefficient, and wherein the second resistance is selected based, at least in part, upon a difference between: (a) a product between the first resistance and the first negative temperature coefficient, and (b) a product between the second resistance and a second negative temperature coefficient of the second resistor.

17. The electronic device of claim 16, wherein the first negative temperature coefficient is different from the second negative temperature coefficient.

18. A method, comprising:
coupling a voltage generator to a first input of a common gate amplifier, the voltage generator having a first resistor coupled to the first input; and
coupling a frequency-to-voltage converter to a second input of the common gate amplifier, the frequency-to-voltage converter having a second resistor coupled to the second input, wherein the second resistor has a second resistance selected based, at least in part, upon a first resistance of the first resistor, wherein temperature coefficients of the first resistor and the second resistor are either both positive temperature coefficients or both negative temperature coefficients.

19. The method of claim 18, wherein the second resistance is selected based, at least in part, upon a difference between: (a) a product between the first resistance and a first positive temperature coefficient of the first resistor, and (b) a product between the second resistance and a second positive temperature coefficient of the second resistor.

20. The method of claim 18, wherein the second resistance is selected based, at least in part, upon a difference between: (a) a product between the first resistance and a first negative temperature coefficient of the first resistor, and (b) a product between the second resistance and a second negative temperature coefficient of the second resistor.

* * * * *